(12) United States Patent
Tomita et al.

(10) Patent No.: US 6,679,950 B2
(45) Date of Patent: Jan. 20, 2004

(54) CLEANING METHOD AND CLEANER

(75) Inventors: Hiroshi Tomita, Kanagawa (JP); Motoyuki Sato, Kanagawa (JP); Soichi Nadahara, Kanagawa (JP); Mitsuhiko Shirakashi, Kanagawa (JP); Kenya Ito, Kanagawa (JP)

(73) Assignee: Ebara Corporation, Tokyo (JP)

( * ) Notice: Subject to any disclaimer, the term of this patent is extended or adjusted under 35 U.S.C. 154(b) by 232 days.

(21) Appl. No.: 09/892,742

(22) Filed: Jun. 28, 2001

(65) Prior Publication Data

US 2002/0005214 A1 Jan. 17, 2002

(30) Foreign Application Priority Data

Jun. 29, 2000 (JP) .......................................... 2000-197233

(51) Int. Cl.⁷ .................................................. B08B 3/00
(52) U.S. Cl. ............................. 134/36; 134/2; 134/37; 134/42; 134/902; 134/6; 15/77; 15/88.2; 15/102
(58) Field of Search ................................ 15/77, 88.2, 102; 134/2, 6, 36, 37, 42, 902

(56) References Cited

U.S. PATENT DOCUMENTS

| | | | | |
|---|---|---|---|---|
| 5,248,380 A | * | 9/1993 | Tanaka | 216/59 |
| 5,261,966 A | * | 11/1993 | Mashimo et al. | 134/2 |
| 5,464,480 A | * | 11/1995 | Matthews | 134/1.3 |
| 6,148,463 A | * | 11/2000 | Shimizu et al. | 15/102 |
| 6,158,075 A | * | 12/2000 | Tanaka et al. | 15/102 |
| 6,167,891 B1 | * | 1/2001 | Kudelka et al. | 134/1.3 |
| 6,431,185 B1 | * | 8/2002 | Tomita et al. | 134/1.3 |
| 2002/0005214 A1 | * | 1/2002 | Tomita et al. | 134/36 |
| 2002/0011254 A1 | * | 1/2002 | Puri et al. | 134/1.3 |

* cited by examiner

Primary Examiner—Sharidan Carrillo
(74) Attorney, Agent, or Firm—Wenderoth, Lind & Ponack L.L.P.

(57) ABSTRACT

A substrate cleaning method of the present invention enables effective cleaning of a wafer having a recess therein without causing any increase in cleaning costs. Ozone gas and ammonia water are supplied to an area right above a wafer 7 having a recess therein, and a gas-dissolving liquid is produced by dissolving the ozone gas in the ammonia water. The gas-dissolving liquid is used to carry out contact and non-contact types of physical cleaning on the wafer.

18 Claims, 6 Drawing Sheets

Fig. 9A  DISHING

Fig. 9B  SCRACH

Fig. 9C  ALIGNMENT MARKER

CLEANING METHOD AND CLEANER

BACKGROUND OF THE INVENTION

The present invention relates to a substrate cleaning method and a substrate cleaner.

Of the substrate cleaning methods for use in a semiconductor fabrication process, those utilizing physical force are divided into two types: contact and non-contact. As the contact type method, one in which an object to be cleaned is scrubbed with a pencil sponge or roll sponge made of PVA is known. As the non-contact type method, one which utilizes sound pressure (ultrasonic vibrations) or hydraulic pressure is known.

The chemicals used in these types of physical cleaning include, for example, ones containing anionic ammonia water, ones having oxidative capability (ozonized water, hydrogen peroxide water), and cationic ones such as hydrochloric acid and hydrofluoric acid.

When supplying the mixture of those chemicals to a wafer (semiconductor substrate), it is necessary to mix plural kinds of chemicals (for example, ozonized water and ammonia water) outside the cleaner itself beforehand. In other words, equipment other than the cleaner itself is needed. Although various methods have been reported in which chemicals are mixed immediately before the portion of the wafer to be processed, all of them are basically methods of mixing chemicals.

In the above described methods of mixing chemicals beforehand, when using a chemical containing a highly self-reactive substance (for example, when using ozonized water), ozone molecules in the ozonized water undergo self-decomposition and the ozone concentration decreases while the ozonized water is being supplied to the portion of the wafer to be processed. Furthermore, depending on the chemicals to be mixed with the ozonized water (for example, alkaline solutions such as ammonia water), the ozone concentration may extremely decrease. Thus, the physical cleaning methods in current use have a problem that, when using a chemical mixture containing a highly self-reactive substance, a wafer cannot be cleaned effectively.

Figure 9A:
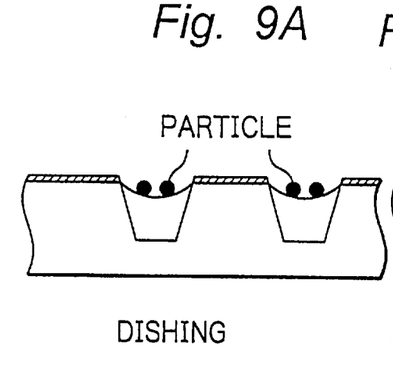
FIGS. 9(a), 9(b) and 9(c) are views showing examples of a recess in wafers.
Figure 9B:
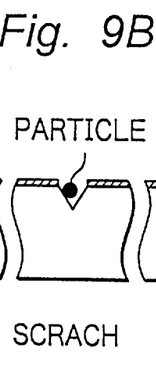
Figure 9C:
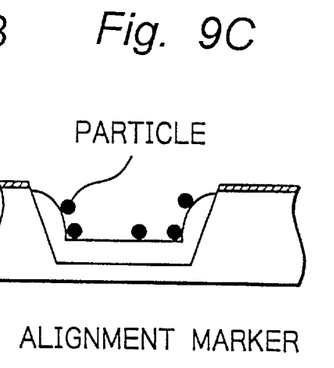

In the case of contact type cleaning methods, it is difficult to remove particles (contaminants) in a recess of an object to be cleaned which are impossible to bring in contact with a cleaning chemical. Such a recess includes, for example, those formed dishing due to chemical mechanical polishing (CMP), a scratch, or an alignment marker, as shown in FIG. 9. Such particles include, for example, abrasive grains in a slurry used in CMP.

In order to remove particles adsorbed onto a recess, it is necessary to use non-contact type methods which utilize sound pressure or hydraulic pressure. However, in the cleaning methods utilizing sound pressure, in particular, ultrasonic vibrations, there is a difference in cleaning effect depending on the concentration of the gas dissolved in the chemical used.

Accordingly, in order to make ultrasonic cleaning effective, ultrapure water is needed which has undergone dissolved gas control, and which in turn requires facilities such as a dissolving system. This requirement gives rise to a problem of imposing higher costs on the factory side.

The above described contact type cleaning methods, which utilize a pencil sponge, etc., are effective in removing particles adsorbed on a wafer. On the other hand, the non-contact type cleaning methods are effective in removing particles in a recess, which cannot be removed by the contact type cleaning methods.

Accordingly, when there exists a recess on a wafer, in order to fully remove the particles remaining on the wafer, it is necessary to carry out contact type and non-contact type physical cleaning at the same time, which requires two cleaning modules to be prepared. This leads to an increase in cleaning cost.

SUMMARY OF THE INVENTION

As described above, the conventional substrate cleaning methods utilizing physical force have a problem in that, when using a chemical mixture containing a highly self-reactive substance, effective cleaning of a wafer is impossible.

Further, when there exists a recess on a wafer, in order to fully remove the particles remaining in the recess, it is necessary to carry out both contact type and non-contact type physical cleaning at the same time. However, this requires two cleaning modules to be prepared and, therefore, gives rise to a problem of increasing cleaning costs.

The present invention was made in view of the above problems. Accordingly, the object of the present invention is to provide a substrate cleaning method and substrate cleaner which provide effective cleaning even with a chemical containing a highly self-reactive substance, prevent cleaning costs from increasing, and provide effective cleaning of the object having a recess thereon.

Of aspects of the present invention disclosed in the present application, the typical one will be described below. In order to accomplish the above object, the substrate cleaning method of the present invention includes: a step of supplying a liquid and a gas onto an object to be cleaned and dissolving the above gas in the above, liquid so as to produce a gas-dissolving (i.e., gas-containing) liquid; and a step of cleaning the above object to be cleaned with the above gas-dissolving liquid. The object to be cleaned is, for example, a wafer (substrate) or a wafer (substrate) having been subjected to processing such as CMP.

If a gas-dissolving liquid is produced on an object to be cleaned as described above, even in cases where the gas-dissolving liquid contains a highly self-reactive substance, the gas-dissolving liquid can be supplied to the object to be cleaned immediately after its production. Therefore, the concentration of the highly self-reactive substance can be prevented from decreasing. Accordingly, even if a chemical containing a highly self-reactive substance is used, cleaning can be carried out effectively. This method is quite effective, particularly when the use point is a system open to atmosphere.

Furthermore, supplying the gas-dissolving liquid to the object to be cleaned at a high pressure enables non-contact type physical cleaning. Therefore, the object having a recess can be cleaned effectively. In addition, the steps of producing the gas-dissolving liquid and of supplying the gas dissolving liquid to the object to be cleaned at a high pressure can be carried out in one cleaner, so that cleaning costs are prevented from increasing.

Further, the substrate cleaner of the present invention includes: a mixing portion, which consists of a sponge-like member and has a through-path formed by removing a certain area of sponge-like member; a liquid introducing means for introducing a cleaning liquid into the above through-path; and a gas introducing means for introducing a cleaning gas into the above mixing portion.

It is to be understood that the expression "a through-path formed by removing a certain area of the sponge like member", which refers to the process of forming a through-pass, is used only to express the component (the mixing portion) of the present invention in a simple manner, and is not intended to limit the forming method of the above component.

In the construction as described above, if a cleaning liquid is introduced into the through-path by the liquid introducing means at, for example, a high pressure, the cleaning gas which has been introduced into the mixing portion by the gas introducing means can be introduced into the through-path on the aspirator's principle. In other words, the cleaning gas and liquid can be easily mixed in the through-path, and thereby a gas-dissolving liquid can be easily produced. Thus, the cleaning method according to the present invention can be carried out.

The foregoing and other objects and new features of the present invention will be better understood from the detailed description of the invention with reference to the accompanying drawings.

DETAILED DESCRIPTION OF THE PREFERRED EMBODIMENTS

In the following, an embodiment of the present invention will be described with reference to the accompanying drawings.

The characteristic of the substrate cleaning method of this embodiment is that a liquid containing a cleaning gas (a gas-dissolving liquid) is produced right above a wafer, and contact and non-contact types of physical cleaning are carried out at the same time using the gas-dissolving liquid.

Specifically, first a gas of a highly self-reactive substance (for example, ozone) as a cleaning gas and a liquid (pure water or a chemical) are continuously supplied to a point right above a wafer at the same time, and the gas is dissolved in the liquid to produce a gas-dissolving liquid containing a highly self-reactive substance (a first step). Then the gas-dissolving liquid is supplied to the wafer at a high pressure to remove particles (contaminants) on the wafer by contact and non-contact types of physical cleaning (a second step) and, the wafer is rinsed with pure water (a third step). Lastly, the wafer is dried (a fourth step). The above first to fourth steps are carried out continuously. When supplying pure water during the first step, chemicals such as ammonia water, as well as the gas-dissolving liquid, are supplied during the second step.

If a gas-dissolving liquid is produced right above a wafer, as described above, even in cases where the gas-dissolving liquid contains a highly self-reactive substance, the gas-dissolving liquid can be supplied to the wafer immediately after its production. Therefore, the concentration of the highly self-reactive substance can be prevented from decreasing. Furthermore, the continuous supply of a cleaning gas of a highly self-reactive substance also contributes preventing the concentration of the highly self-reactive substance from decreasing.

Accordingly, according to this embodiment, cleaning can be carried out effectively using a chemical containing a highly self-reactive substance. It is also quite effective, particularly when the point of use is a system open to the atmosphere. Further, when using a, chemical as a cleaning liquid, in which the chemical is highly reactive with a cleaning gas, cleaning can be carried out effectively because the concentration of the highly self-reactive substance in the gas-dissolving liquid can be inhibited from decreasing for the same reason as above.

Figure 1:
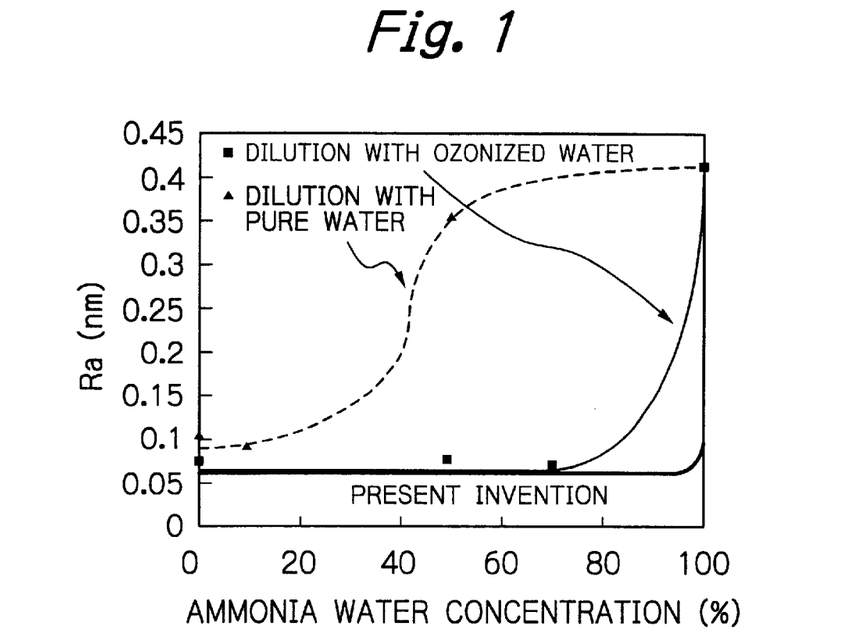
FIG. 1 is a graph showing the relationship between the surface roughness of the silicon substrate having been cleaned by the methods in current use and of the present invention and the dilution ratio of ammonia water.

Referring to FIG. 1, a relationship between the surface roughness of a silicon substrate and the ammonia water concentration (%) diluted with a diluent (ozonized water, pure water or gas-dissolving liquid) is illustrated for each of the cases in which a silicon substrate was cleaned with ammonia water diluted with ozonized water (conventional method), a silicon substrate was cleaned with ammonia water diluted with pure water (conventional method), and a silicon substrate was cleaned with ammonia water diluted with a gas-dissolving liquid containing ozone gas and ozonized water which is formed right above the silicon substrate (method of the present invention). The surface roughness was evaluated with Ra, the ammonia concentration of the ammonia water used was 0.1%, and the ozone concentration of the ozonized water used was 15 ppm.

It is apparent from FIG. 1 that, when diluting ammonia water with pure water, even if the ammonia water is diluted to be about 20% in terms of volume ratio, the surface of the substrate becomes rough. When diluting ammonia water with ozonized water, if the ammonia water is diluted to be about 70% in terms of volume ratio with the ozonized water (30% in terms of volume ratio), the surface roughness of the substrate is inhibited. In other words, if the ammonia water concentration is more than 70%, the surface of the substrate becomes rough. Thus, it is apparent that, when carrying out physical cleaning using ammonia water, the surface roughness of the silicon substrate caused by ammonia water (alkaline etching) cannot be inhibited even by the use of pure water or simple ozonized water as a diluent.

On the other hand, when diluting ammonia water with a gas-dissolving liquid containing ozone gas and ozonized water, if only a small % of ozone is supplied to the ammonia water, the surface roughness does not increase even due to alkaline etching. This is because high concentrations of ozone gas and ozonized water always coexist in ammonia water.

Figure 2:
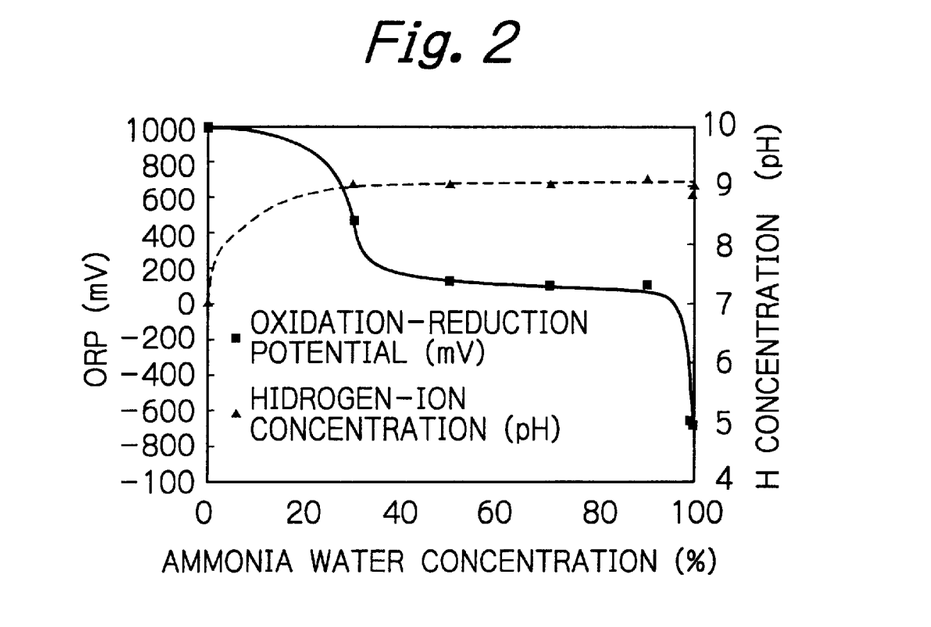
FIG. 2 is a graph showing the relationships between the oxidation-reduction potential and the dilution ratio of ammonia water as well as between the hydrogen concentration and the dilution ratio of ammonia water for the ammonia water diluted with ozonized water.

Referring to FIG. 2, relationships between the oxidation-reduction potential (ORP) and the diluted ammonia water concentration, and between the hydrogen concentration and the diluted ammonia water concentration for the ammonia water diluted with ozonized water are shown.

It is apparent from the same figure that, when the diluted ammonia water concentration is about 30% or more, the oxidation-reduction potential of ozone gas decreases. This may be because addition of ammonia water (alkaline aqueous solution) to ozonized water inhibits the ozonized water from being decomposed into ozone, and thereby the ozone concentration decreases. As seen from FIGS. 1 and 2, even in the area where the dilution ratio of ammonia water is 70% or more, in particular, 90% or more and where ORP shows minus characteristics, almost no surface roughness is produced on the surface of the silicon substrate. In other words, when diluting ammonia water with a gas-dissolving liquid containing ozone gas and ozonized water, since ozone gas is always supplied to the substrate surface, the ozone concentration can be inhibited from decreasing.

Further, in the cleaning method according to this embodiment, the gas-dissolving liquid is supplied to a wafer at a high pressure. This enables a non-contact type of physical cleaning, such as a water jet type and a cavitation jet type, whereby particles on a wafer having a recess therein can be removed effectively. Moreover, since the steps of producing a gas-dissolving liquid and of supplying the gas-dissolving liquid to a wafer at a high pressure can be carried out in one cleaner as described below, the cost can be inhibited from increasing.

Figure 3:
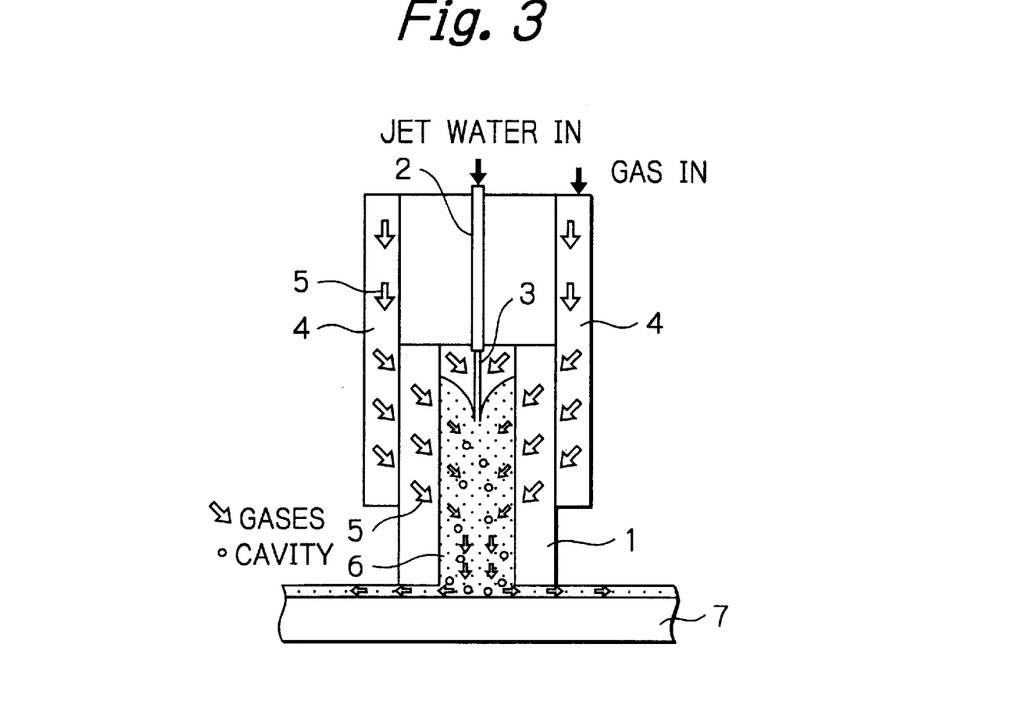
FIG. 3 is a schematic view of a substrate cleaner according to one embodiment of the present invention.

Referring to FIG. 3, there is shown a schematic view of the main part of a substrate cleaner for carrying out the above-described cleaning method. This is a case in which the present invention is applied to a pencil sponge type substrate cleaner.

In the same figure, reference numeral 1 denotes a pencil sponge (mixing portion), which consists of a cylindrical sponge-like member and includes a cylindrical through-path concentric with the above cylindrical sponge like member and which is formed by removing part of the cylindrical sponge like member in the longitudinal direction. The diameter of the cylindrical through-path is, for example, 5 nm.

At one end (liquid introducing port) of the pencil sponge 1, a high-pressure water supplying nozzle 2 is provided. A high-pressure liquid (high-pressure pure water) 3 for cleaning is supplied from the high-pressure water supplying nozzle 2 and passes through the through-path and is discharged from the other end (liquid discharge port) of the pencil sponge 1. Needless to say, the sponge 1 can be substituted by porous material, such as a urethane material, poly vinyle acetate (CVA) material, etc. which are softer than the substrate.

Outside of the pencil sponge 1 is a gas supplying member 4 for introducing a pressured cleaning gas into the pencil sponge 1. Part of the gas supplying member 4 is in contact with the pencil sponge 1. In the portion of the gas supplying member 4 which is in contact with the pencil sponge 1 are holes, not shown in the figure, through which the pressurized cleaning gas is introduced into the sponge 1.

Into the through path of the pencil sponge 1 the high-pressure pure water 3 is being supplied. Therefore, based on the aspirator's principle (aspiration), a cleaning gas 5 is sucked into the through path of the pencil sponge 1, where the cleaning gas 5 and the cleaning liquid 3 are mixed, resulting in production of a high-pressure gas dissolving water 6 consisting of the high-pressure pure water 3 for use in cleaning and the cleaning gas 5 dissolved in the above pure water 3 at a high concentration. This high-pressure gas dissolving liquid is discharged from the liquid discharge port of the pencil sponge 1 and is supplied to a wafer 7. At this time, in addition to the gas-dissolving liquid, a chemical such as ammonia water is also supplied from a chemical supplying member (not shown in the figure) to the wafer 7.

Figure 4:
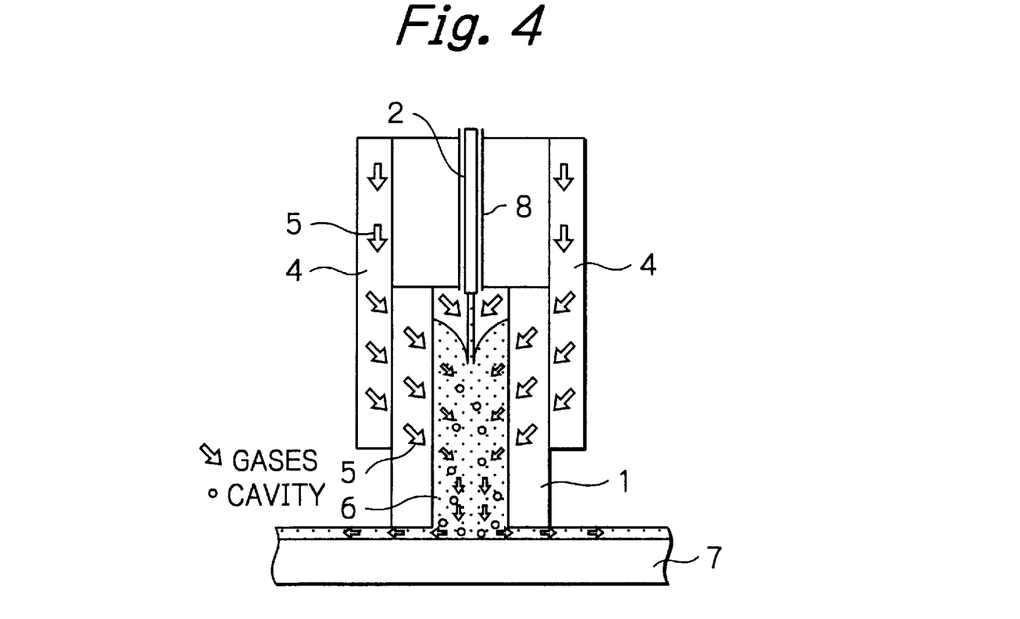
FIG. 4 is a view showing one variation of the cleaner of FIG. 3.

The use of a nozzle having a duplex-pipe structure, that is, a high-pressure water supplying nozzle 2 with its periphery wrapped in a low-pressure liquid (chemical) supplying nozzle 8, as shown in FIG. 4, makes the above described chemical supplying portion unnecessary. In addition, since the chemical is supplied at a low pressure, the amount of the chemical supplied is easy to control. Furthermore, even if the cleaning gas 5 is highly reactive with the chemical, a mixed chemical with high gas concentration can be formed, since the cleaner is allowed to have a structure such that the pencil sponge 1 can be filled with the gas 5. The possible combinations of a chemical and a gas 5 include, for example, the combination of ammonia water and ozone gas.

Figure 5:
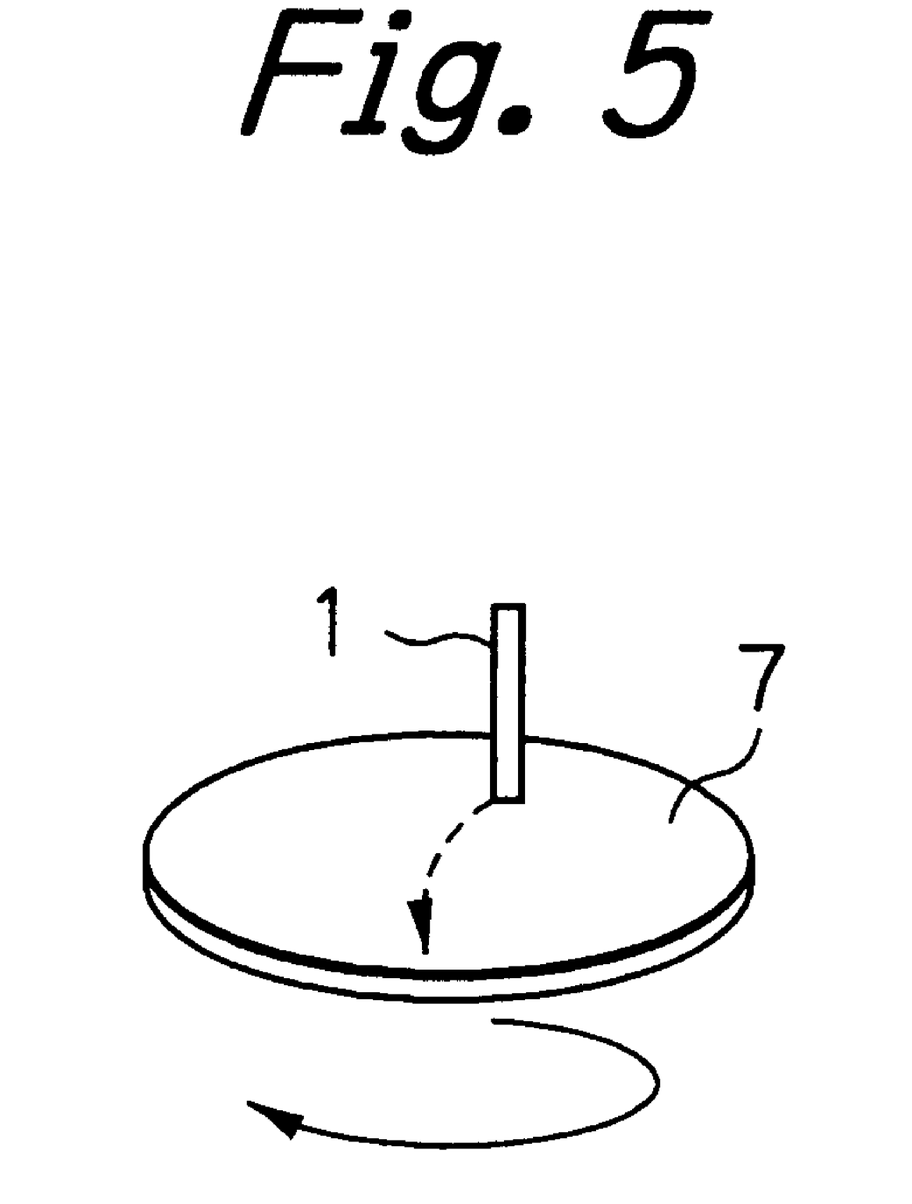
FIG. 5 is a view showing the operation of the pencil sponge and wafer of the cleaner of FIG. 3 or FIG. 4.

Cleaning is carried out in such a manner as to press the pencil sponge 1 against the rotating wafer 7 while allowing the same to elliptically scan the wafer in the direction of the diameter thereof, as shown in FIG. 5.

Cleaning can be carried out even when the pencil sponge 1 and the wafer 7 are out of contact with each other. However, if the contact pressure is lowered and the pencil sponge 1 and the wafer 7 do not contact each other, the gas dissolving liquid becomes hard to accumulate inside the pencil sponge 1, and the amount of the gas dissolving liquid supplied decreases. Therefore, cleaning is preferably carried out when the pencil sponge 1 and the wafer 7 are in contact with each other. Hard parameters, such as the contact pressure of the pencil sponge 1 against the wafer 7, the gas supplying pressure, the high-pressure water supplying pressure, and the amount of pure water (chemical) can be set in any manner. Further, although the diameter of the cylindrical through-path formed within the pencil sponge 1 has been described as 5 mm, the dimension is variable.

Figure 6:
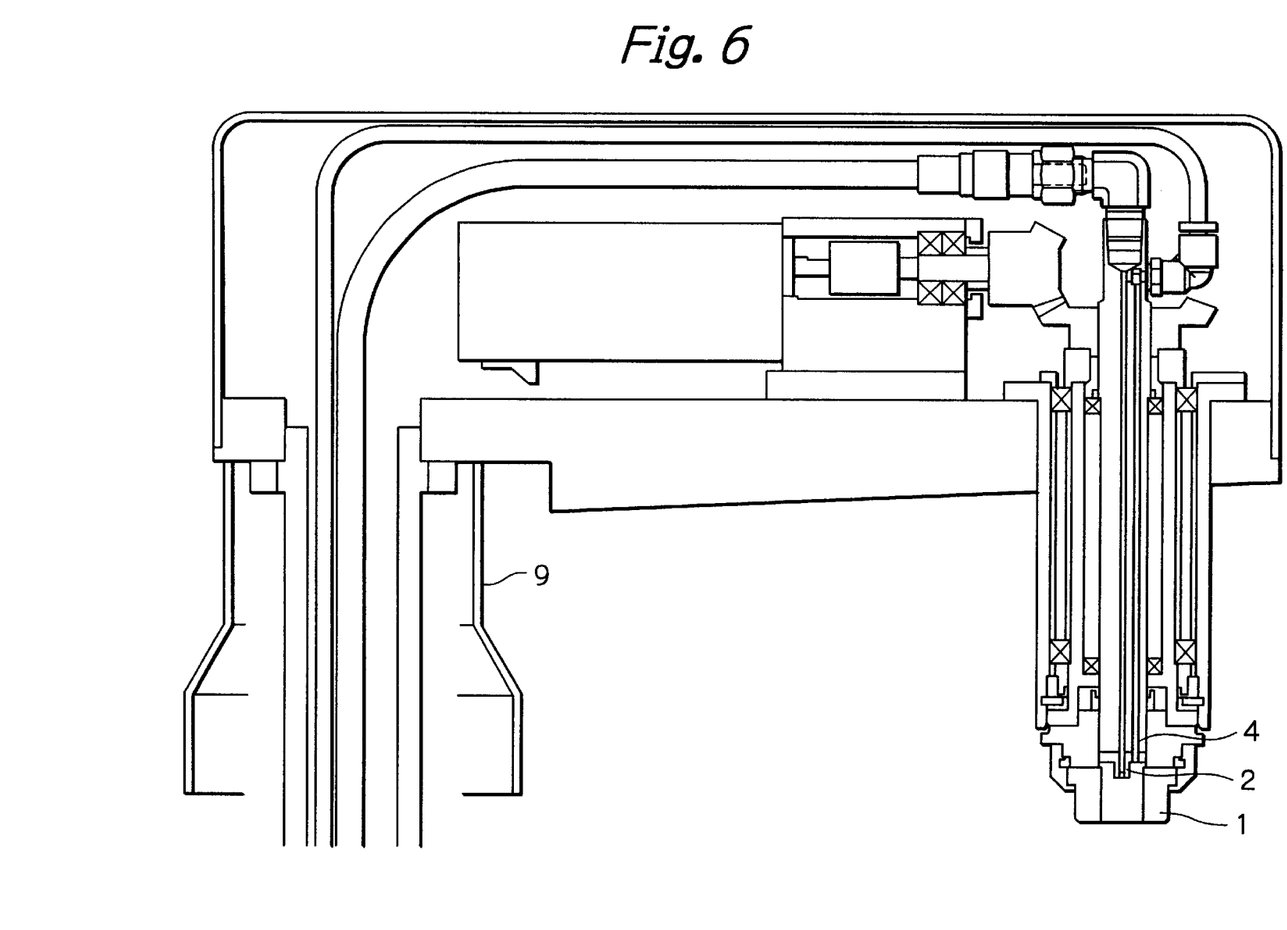
FIG. 6 is a view showing an actual configuration of a substrate cleaner according to one embodiment of the present invention.
Figure 7:
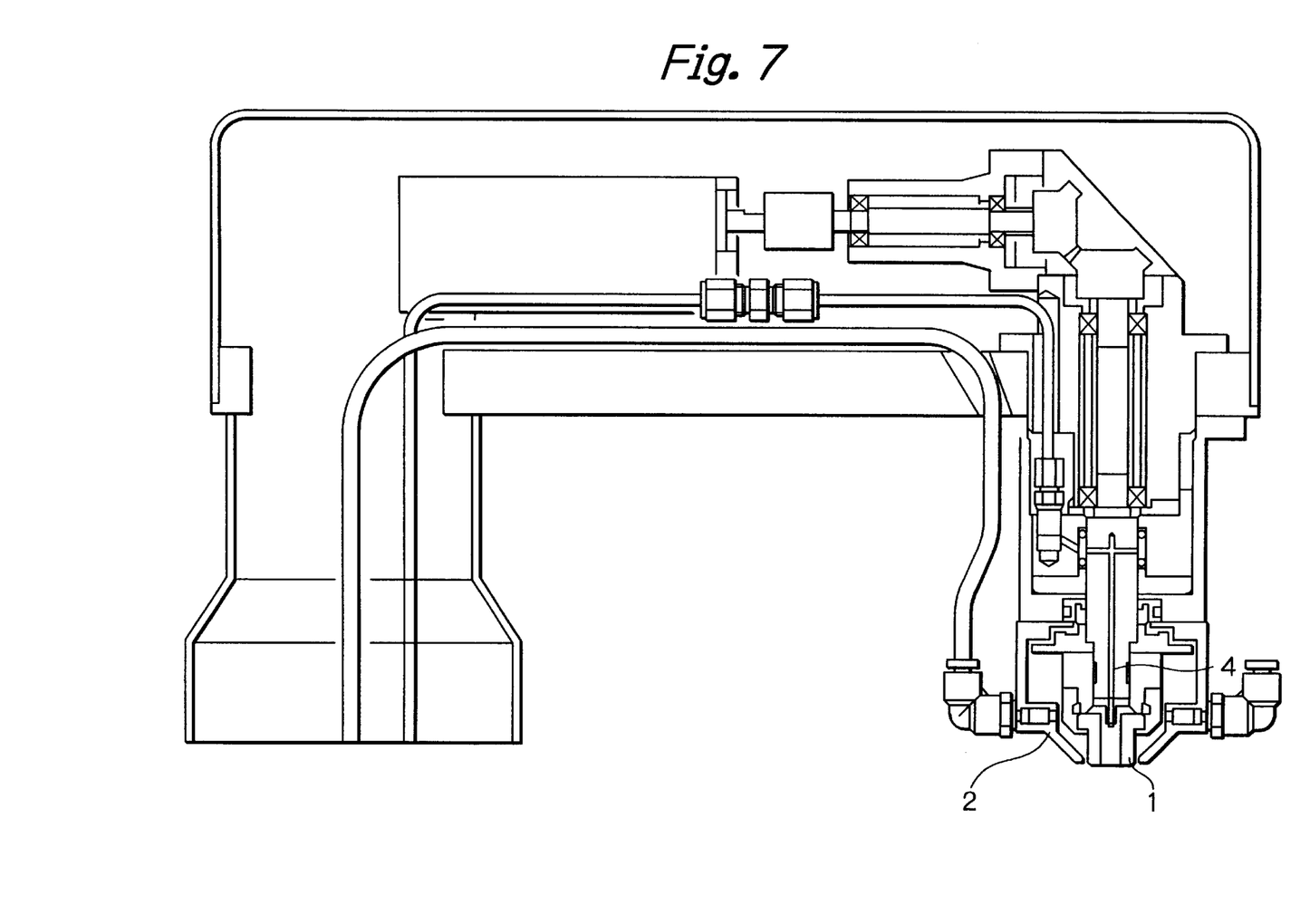
FIG. 7 is a view showing one variation of the cleaner of FIG. 6.

Referring to FIG. 6, there is shown a more realistic configuration of a cleaner for carrying out the above-described cleaning method. In the same figure, reference numeral 9 denotes an arm. The arm 9 supports the main part of the cleaner shown in FIG. 3, and its downward motion allows the pencil sponge 1 to be pressed against the wafer 7. As shown in FIG. 7, the cleaner may have a configuration in which the pencil sponge 1 and the gas supplying member 4 are not in contact with each other. The essential thing is to introduce the cleaning gas into the pencil sponge 1.

Figure 8A:
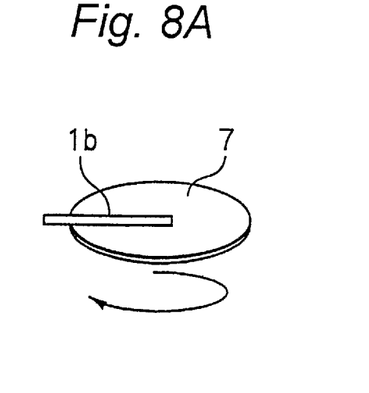
FIGS. 8(a) and 8(b) are views showing another variation of the sponge of the cleaner of FIG. 5.

Referring to FIG. 8, there is shown a variation of the cleaner shown in FIG. 3. Although a pencil sponge (nozzle type sponge) has been used in this embodiment, a bar type sponge 1b may also be used, as shown in FIG. 8(a). The bar type sponge 1b is formed of a plate-like sponge-like member extending in one direction, and includes a slit-like through-path extending in the same direction as the above bar-like sponge-like member. The throupgh-path is formed by removing a part of the plate-like sponge-like member extending in one direction in its thickness direction. The width of the slit-like through-path is, for example, 5 mm and the profile of the through-path is just the same as that of FIG. 3. The profile of the through-path, when using a duplex nozzle, (that is, a high-pressure water supplying nozzle with its periphery wrapped in a low-pressure liquid supplying, nozzle) is the same as that of FIG. 4.

Figure 8B:
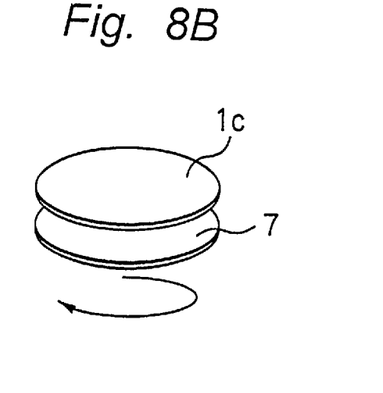

As shown in FIG. 8(b), a cap type brush sponge 1c may also be used. The brush sponge 1c consists of a cap-like sponge-like member, and includes more than one cylindrical through-path formed by removing more than one part of the above cap-like sponge-like member in the direction of its thickness. The number of through-paths is not limited to any specific number, as long as the gas-dissolving liquid can be supplied to the entire wafer. The spacing between the cylindrical through-paths is, for example, 5 mm. The profile of one cylindrical through-path and vicinity is the same as that of FIG. 3, and the profile of one cylindrical through-path and vicinity, when using a duplex nozzle, (that is, a high-pressure water supplying nozzle with its periphery wrapped in a low-pressure liquid supplying, nozzle) is the same as that of FIG. 4.

Although this embodiment has been described with respect to the case in which ozone gas is used as a cleaning gas and ammonia water is used as a cleaning liquid, the chemical gases for cleaning during the semiconductor fabrication process may also be used as a cleaning gas. Those gases include, for example, hydrochloric acid (HCl) gas, hydrofluoric acid (HF) gas or ammonia ($NH_3$) gas. Further, although this embodiment has been described in terms of the cleaner which includes only one gas supplying member 4, the cleaner may have more than one gas supplying member 4. In this case, gases different from each other, such as hydrochloric acid gas and ozone gas, can be introduced into the pencil sponge 1 at the same time through the different gas supplying members 4, so that cleaning can be carried out more effectively.

On the other hand, the usable cleaning liquids other than ammonia water include, for example, HCl water or HF water, or the electrolytic acid water or electrolytic alkaline water thereof, or electrolytic anodic water or electrolytic cathodic water of pure water obtained by electrolyzing pure water. The usable cleaning liquids further include the mixture of the above described liquids, with an anionic or cationic surfactant added thereto.

Although this embodiment has been described with respect to a case in which a sponge is used for the contact type of physical cleaning, the same effect can be obtained when using cleaning members other than a sponge, such as a brush.

Although this embodiment has also been described with respect to a case in which water jet type and cavitation jet type cleaning using high-pressure water (jet) are used as the non-contact type of physical cleaning, the same effect can be obtained when using ultrasonic cleaning.

However, when using ultrasonic cleaning, the aspirator effect due to the high-pressure pure water 3 for use in cleaning is not produced in a mixing portion such as pencil sponge. Therefore, it is necessary to introduce a highly pressurized cleaning gas into the gas supplying portion 4 using, for example, a pump.

While the invention has been described in terms of its preferred embodiment, those skilled in the art will recognize that various changes and modifications can be made in it without departing from the spirit and scope thereof.

As described so far, according to the present invention, a substrate cleaning method and a substrate cleaner can be realized which enable effective cleaning even when using a chemical containing a highly self-reactive substance, inhibition of cleaning cost from increasing, and effective cleaning of the objects with a recess therein.

What is claimed is:

1. A wafer cleaning method comprising:
   supplying a liquid and a gas into a sponge mixing member positioned on the wafer to be cleaned so that the gas is dissolved in the liquid to produce a gas-containing liquid; and
   cleaning the wafer using the gas-containing liquid.

2. The wafer cleaning method of claim 1, wherein the liquid comprises one of water, ammonia water, hydrochloric acid water, and hydrofluoric acid water.

3. The wafer cleaning method of claim 1, wherein the gas comprises one of ozone, hydrochloric acid gas, hydrofluoric acid gas, and ammonia gas.

4. The wafer cleaning method of claim 2, wherein the liquid comprises one of:
   electrolytic acid water or electrolytic alkaline water;
   hydrochloric acid water;
   hydrofluoric acid water;
   electrolytic anodic water or electrolytic cathodic water obtained by electrolyzing pure water; and
   a liquid mixture of an anionic or cationic surfactant and at least one of electrolytic acid water or electrolytic alkaline water, hydrochloric acid water, hydrofluoric acid water, and electrolytic anodic water or electrolytic cathodic water obtained by electrolyzing pure water.

5. The wafer cleaning method of claim 1, wherein said supplying of the liquid and gas into the mixing member comprises supplying pure water into the mixing member through a first nozzle, simultaneously supplying a chemical liquid into the mixing member through a second nozzle, and simultaneously supplying the gas into the mixing member through a gas supplying member.

6. The wafer cleaning method of claim 1, wherein said cleaning comprises cleaning the wafer using both the gas-containing liquid and the sponge mixing member contacting a surface of the wafer.

7. The wafer cleaning method of claim 5, wherein the first nozzle, the second nozzle, and the gas supplying member are arranged concentrically.

8. The wafer cleaning method of claim 5, wherein the chemical liquid comprises ammonia water and the gas comprises ozone gas.

9. The wafer cleaning method of claim 5, wherein the pure water is supplied through the first nozzle at a higher pressure than the chemical liquid supplied through the second nozzle.

10. A substrate cleaning method comprising:
    supplying a liquid from a liquid-introducing member into a sponge-like member so as to suck a gas into the sponge member from a gas-introducing member by aspiration to produce a gas-containing liquid; and
    cleaning the substrate by creating contact between the gas-containing liquid and the substrate to be cleaned.

11. The substrate cleaning method of claim 10, wherein said cleaning of the substrate comprises both creating contact between the gas-containing liquid and the substrate and creating contact between the sponge member and the substrate.

12. The substrate cleaning method of claim 10, wherein the liquid-introducing member and the gas-introducing member are arranged concentrically.

13. The substrate cleaning method of claim 10, wherein the liquid comprises one of water, ammonia water, hydrochloric acid water, and hydrofluoric acid water.

14. The substrate cleaning method of claim 10, wherein the gas comprises one of ozone, hydrochloric acid gas, hydrofluoric acid gas, and ammonia gas.

15. The substrate cleaning method of claim 10, wherein the liquid-introducing member comprises a duplex-pipe structure such that said supplying of the liquid into the sponge member comprises supplying pure water into the sponge-like member through a first nozzle of the duplex-pipe structure and simultaneously supplying a chemical liquid into the sponge member through a second nozzle of the duplex-pipe structure, the second nozzle being concentric with the first nozzle.

16. The substrate cleaning method of claim 15, wherein the gas is sucked into the sponge member through a gas supplying member arranged concentrically with the first nozzle and the second nozzle.

17. The substrate cleaning method of claim 15, wherein the chemical liquid comprises ammonia water and the gas comprises ozone gas.

18. The substrate cleaning method of claim 15, wherein the pure water is supplied through the first nozzle at a higher pressure than the chemical liquid supplied through the second nozzle.

* * * * *